United States Patent
Pai et al.

(10) Patent No.: US 6,670,279 B1
(45) Date of Patent: Dec. 30, 2003

(54) METHOD OF FORMING SHALLOW TRENCH ISOLATION WITH ROUNDED CORNERS AND DIVOT-FREE BY USING IN-SITU FORMED SPACERS

(75) Inventors: Chih-Yang Pai, Hsin-chu (TW); Bi-Ling Chen, Taipei (TW); Min-Hwa Chi, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 171 days.

(21) Appl. No.: 10/068,055

(22) Filed: Feb. 5, 2002

(51) Int. Cl.$^7$ ............................................... H01L 21/00
(52) U.S. Cl. ........................... 438/719; 216/39; 216/79; 216/99; 438/723; 438/738; 438/745
(58) Field of Search .................. 438/719, 723, 438/724, 737, 738, 743, 744, 745, 753, 756, 757; 216/39, 67, 41, 79, 99

(56) References Cited

U.S. PATENT DOCUMENTS

| | | | |
|---|---|---|---|
| 5,674,775 A | 10/1997 | Ho et al. | 437/67 |
| 5,866,435 A | 2/1999 | Park | 437/65 |
| 6,001,707 A | 12/1999 | Lin et al. | 438/433 |
| 6,174,785 B1 | 1/2001 | Parekh et al. | 438/424 |
| 6,228,727 B1 | 5/2001 | Lim et al. | 438/296 |
| 6,232,203 B1 | 5/2001 | Huang | 438/424 |

*Primary Examiner*—William A. Powell
(74) *Attorney, Agent, or Firm*—George O. Saile; Stephen B. Ackerman; Stephen G. Stanton

(57) ABSTRACT

A method of fabricating an STI structure comprising the following steps. A silicon structure having a pad oxide layer formed thereover is provided. A hard mask layer is formed over the pad oxide layer. The hard mask layer and the pad oxide layer are patterned to form an opening exposing a portion of the silicon structure. The opening having exposed side walls. A spacer layer is formed over the patterned hard mask layer, the exposed side walls of the opening and lining the opening. The structure is subjected to an STI trench etching process to: (1) remove the spacer layer from over the patterned hard mask layer; form spacers over the side walls; (2) the spacers being formed in-situ from the spacer layer; and (3) etch an STI trench within the silicon structure wherein the spacers serve as masks during at least a portion of time in which the STI trench is formed. The STI trench having corners. Any remaining portion of the spacers are removed. A liner oxide is formed at least within the STI trench whereby the liner oxide has rounded corners proximate the STI trench corners. An STI fill layer is formed over the patterned hard mask layer and filling the liner oxide lined STI trench. The STI fill layer is planarized, stopping on the patterned hard mask layer. The patterned hard mask layer and the patterned pad oxide layer are removed to form a divot-free STI structure having rounded corners.

58 Claims, 15 Drawing Sheets

METHOD OF FORMING SHALLOW TRENCH ISOLATION WITH ROUNDED CORNERS AND DIVOT-FREE BY USING IN-SITU FORMED SPACERS

FIELD OF THE INVENTION

The present invention relates generally to semiconductor fabrication and more specifically to methods of forming shallow trench isolation (STI) structures.

BACKGROUND OF THE INVENTION

Shallow trench isolation (STI) has become the most common and important isolation technology for sub-quarter micron complimentary metal oxide semiconductor (CMOS) devices. The edge treatment of STI is one of the key issues to suppress the corner effects and to maintain gate oxide integrity. Issues such as edge leakage, inverse narrow channel effect and "humps" in Id-Vg curves become critical as the isolation pitch is scaled down.

The conventional STI process flow includes pad oxide and chemical vapor deposition (CVD) silicon nitride (SiN) deposition, active area masking, nitride/oxide etching, silicon (Si) trench etching, liner oxidation, high density plasma (HDP) oxide filling, chemical mechanical polishing (CMP) polishing, and nitride and pad oxide removal.

Well known issues in conventional STI processes include corner rounding and divot formation (i.e. oxide recess) along STI edges. The divot at the edge of the STI is formed due to wet dip of pad oxide by an HF solution. Although the liner oxidation can round the corner of the STI edge, the degree of rounding may not be enough.

Several techniques have been developed to reduce the divot slightly by etching the edge of the nitride layer (referred to as "pull-back") after the silicon trench formation (but before liner oxidation). The corner is then exposed and becomes more rounded and thicker by the oxide growth by the subsequent liner oxidation. Another technique adds a poly-buffer layer in between the pad oxide and nitride (referred to as poly-buffer STI) so that the corner can become more rounded during liner oxidation. The poly-buffer layer also can reduce the stress from the nitride to the substrate. The pull-back and poly-buffer techniques may even be combined to result in even greater enhanced performance of STIs.

U.S. Pat. No. 6,228,727 B1 to Lim et al. describes a process to form STIs with rounded corners using spacers and an etch.

U.S. Pat. No. 6,232,203 B1 to Huang describes a process to form STIs without divots.

U.S. Pat. No. 5,866,435 to Park, U.S. Pat. No. 5,674,775 to Ho et al., U.S. Pat. No. 6,174,785 B1 to Parekh et al. and U.S. Pat. No. 6,001,707 to Lin et al. describe related STI fabrication processes.

SUMMARY OF THE INVENTION

Accordingly, it is an object of one or more embodiments of the present invention to provide an improved method of forming shallow trench isolation (STI) structures.

Other objects will appear hereinafter.

It has now been discovered that the above and other objects of the present invention may be accomplished in the following manner. Specifically, a silicon structure having a pad oxide layer formed thereover is provided. A hard mask layer is formed over the pad oxide layer. The hard mask layer and the pad oxide layer are patterned to form an opening exposing a portion of the silicon structure. The opening having exposed side walls. A spacer layer is formed over the patterned hard mask layer, the exposed side walls of the opening and lining the opening. The structure is subjected to an STI trench etching process to: (1) remove the spacer layer from over the patterned hard mask layer; form spacers over the side walls; (2) the spacers being formed in-situ from the spacer layer; and (3) etch an STI trench within the silicon structure wherein the spacers serve as masks during at least a portion of time in which the STI trench is formed. The STI trench having corners. Any remaining portion of the spacers are removed. A liner oxide is formed at least within the STI trench whereby the liner oxide has rounded corners proximate the STI trench corners. An STI fill layer is formed over the patterned hard mask layer and filling the liner oxide lined STI trench. The STI fill layer is planarized, stopping on the patterned hard mask layer. The patterned hard mask layer and the patterned pad oxide layer are removed to form a divot-free STI structure having rounded corners.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

First Embodiment—polysilicon Spacers 26 (FIGS. 1 to 15)

Initial Structure

Figure 1:
FIGS. 1 to 15 schematically illustrate a first preferred embodiment of the present invention.

As shown in FIG. 1, structure 10 is preferably a silicon substrate and is more preferably a silicon semiconductor substrate.

Growth of Pad Oxide 12

Figure 2:
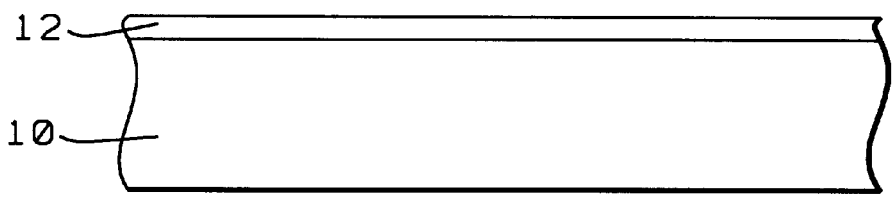

As shown in FIG. 2, a pad oxide layer 12 is grown by any common oxidation process over silicon substrate 10 to a thickness of preferably from about 140 to 210 Å and more preferably from about 150 to 200 Å.

Deposition of Undoped Polysilicon Layer 14

Figure 3:
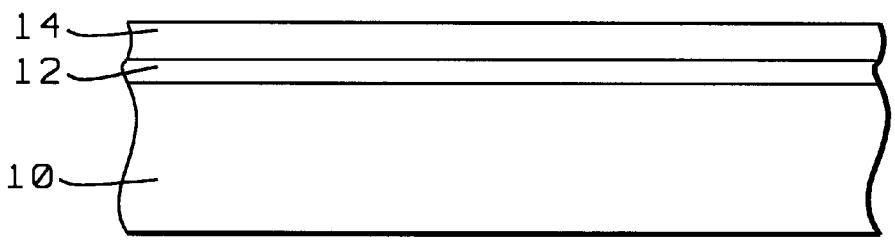

As shown in FIG. 3, an undoped polysilicon (poly) layer 14 is deposited over pad oxide layer 12 to a thickness of preferably from about 400 to 1100 Å and more preferably from about 500 to 1000 Å. Undoped poly layer 14 is preferably formed using a low pressure chemical vapor deposition (LPCVD) furnace.

Formation of Silicon Nitride Layer 16

Figure 4:
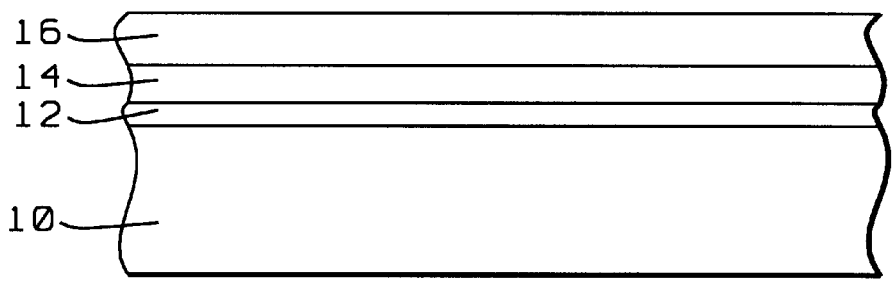

As shown in FIG. 4, a silicon nitride (SiN) layer 16 is deposited over poly layer 14 to a thickness of preferably from about 900 to 2100 Å and more preferably from about 1000 to 2000 Å. SiN layer 16 is preferably formed using a low pressure chemical vapor deposition (LPCVD) furnace.

Definition of Active Area 19

Figure 5:
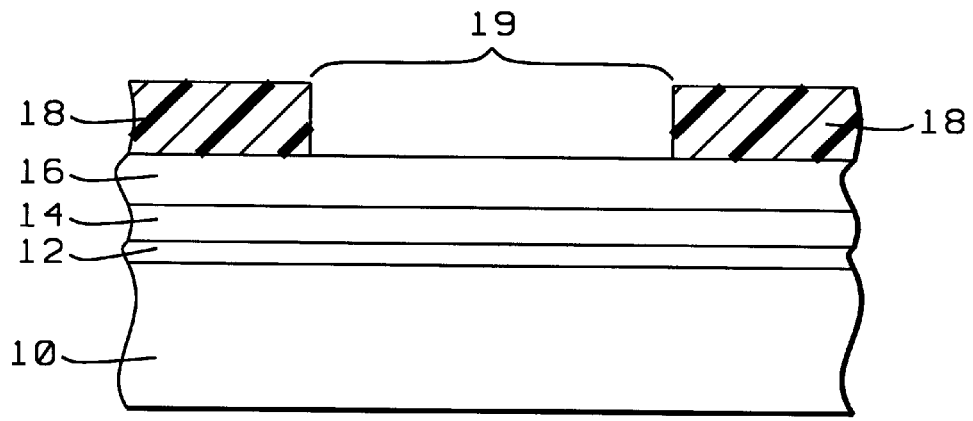

As shown in FIG. 5, a patterned photoresist (PR) layer 18 is formed over SiN layer 16 to define an active area 19.

Etching of Layers 16, 14 and 12

Figure 6:
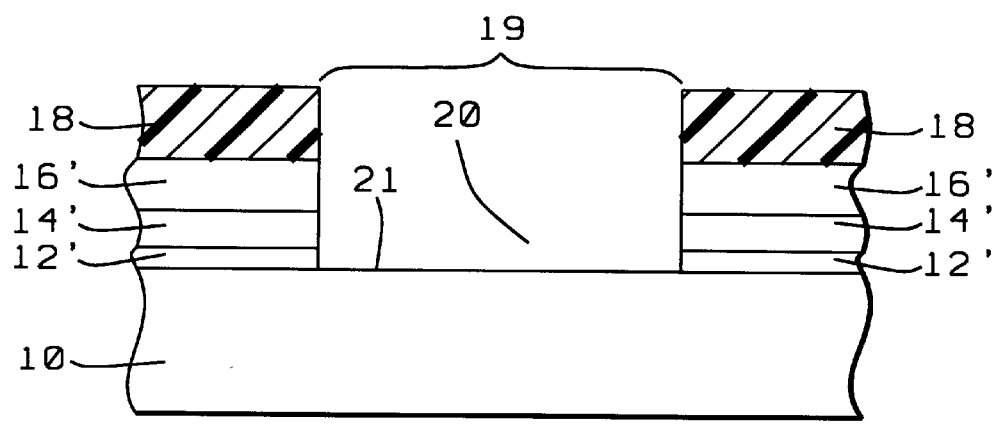

As shown in FIG. 6 and using patterned PR layer 18 as a mask, SiN layer 16, undoped poly layer 14 and pad oxide layer 12 are etched with a dry etch process stopping on Si substrate 10 with less silicon loss to form opening 20 exposing a portion 21 of silicon substrate 10. The dry etch process is conducted at parameters which minimize the loss of silicon from silicon substrate 10 during the dry etch process.

Removal of Patterned PR Layer 18

Figure 7:
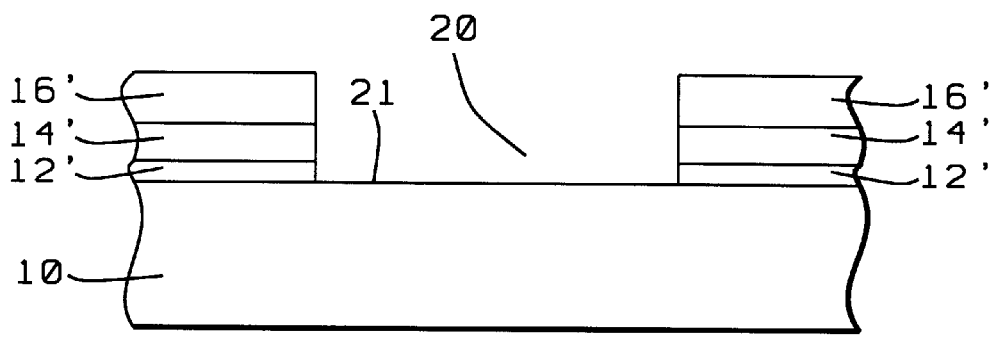

As shown in FIG. 7, the patterned PR layer 18 is removed and the structure is cleaned as necessary.

Deposition of Undoped Poly Film 22

Figure 8:
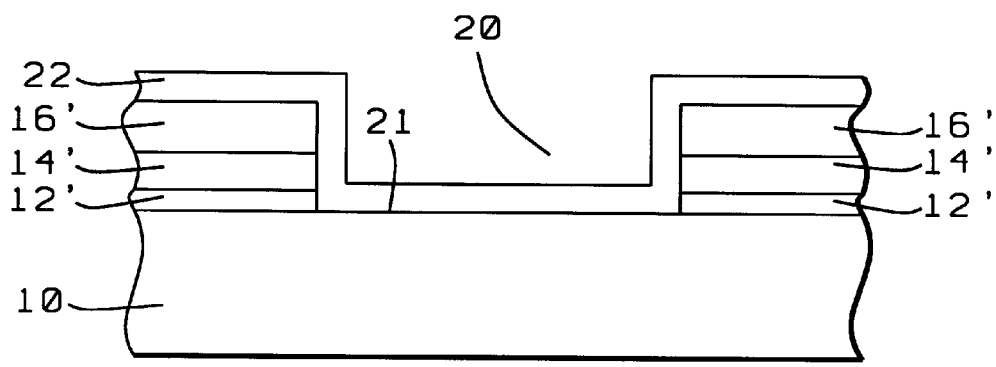

As shown in FIG. 8, an undoped polysilicon (poly) film 22 is formed over patterned SiN layer 16' and lining opening 20. Poly film 22 is formed using an LPCVD furnace to a thickness of preferably from about 400 to 1100 Å and more preferably from about 500 to 1000 Å.

Partial STI Opening 28 Dry Etch 24—Key Step of the Invention

Figure 9:
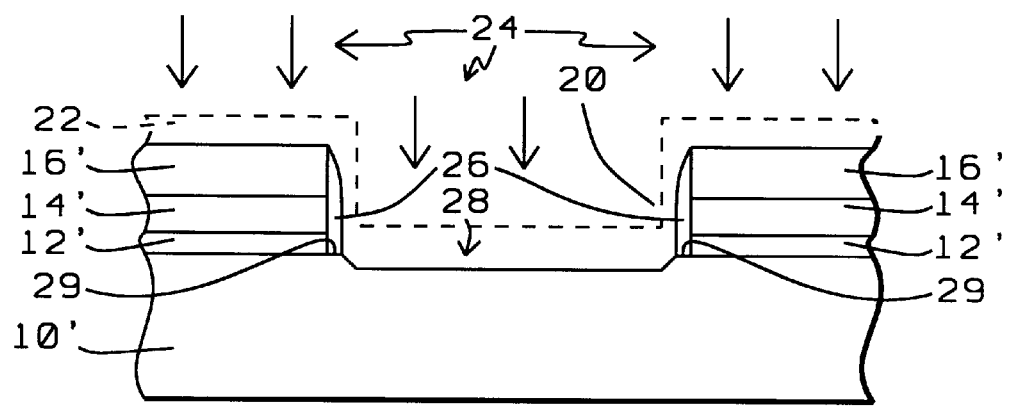

As shown in FIG. 9, an STI dry etch process 24 is initiated using the patterned SiN layer 16' as a hard mask (which has less micro-loading due to low polymer generation) to form partial STI opening 28 within silicon substrate 10.

In a key step of the invention and as is shown in dotted line in FIG. 9, poly film 22 is etched leaving in-situ poly spacers 26 along the side walls of patterned: SiN layer 16'/undoped poly layer 14'/pad oxide layer 12' of opening 20. In-situ poly spacers 26 cover a portion 29 of silicon substrate portion 21 so that partial STI opening 28 has a width less than silicon substrate portion 21. This will, as shown and described below, lead to rounded corners 30' of completed STI structure 38.

Completion of the STI Dry Etch Process 24 to Complete STI Trench 28'

Figure 10:
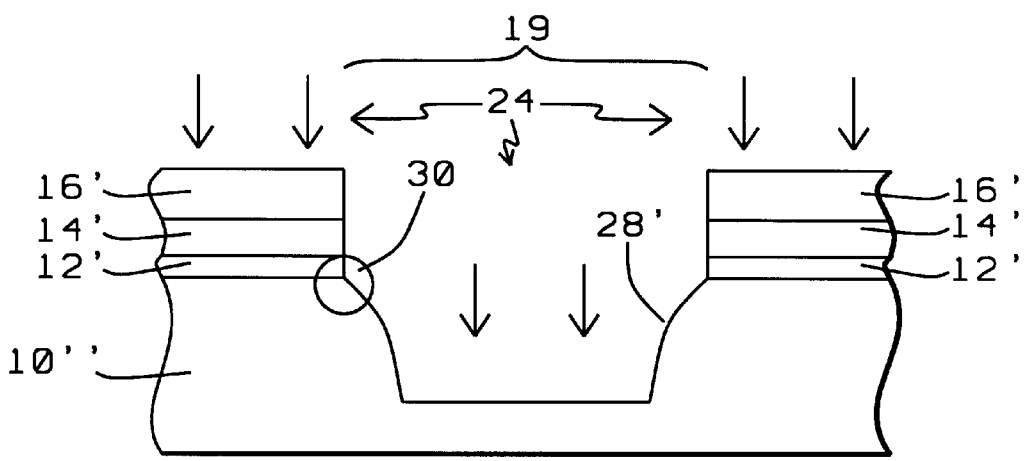

FIG. 10 illustrates the continuation of the STI dry etch 24 which completely removes in-situ poly spacers 26 and completion of the STI dry etch process 24 to complete formation of STI trench 28'. Since the etch rate of the LPCVD in-situ poly spacers 26 is close to the etch rate of the silicon substrate 10 (around 1.2x), the receding in-situ poly spacers 26 allows for rounded corners 30 to be formed at the upperedges of complete STI trench 28'.

Formation of Liner Oxide 32

Figure 11:
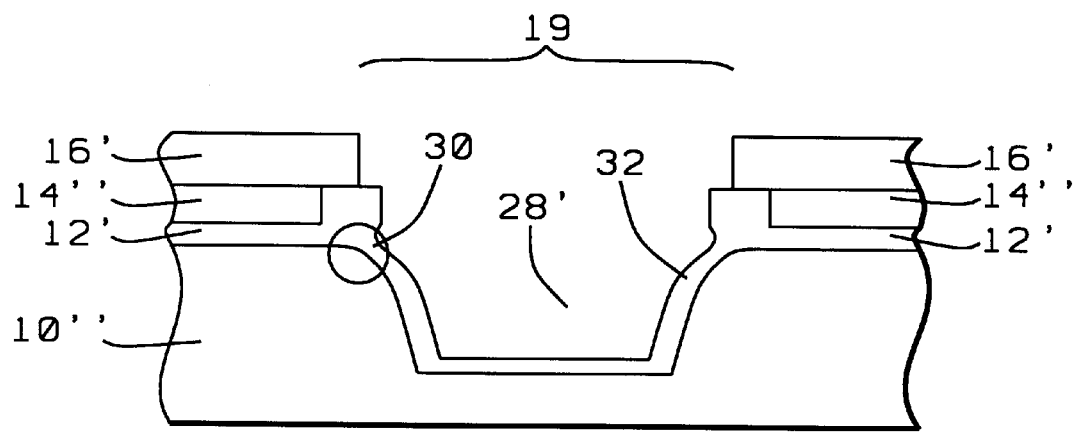

As shown in FIG. 11, liner oxide 32 is formed along the exposed portions of the Si substrate 10 in complete STI trench 28' using a high temperature oxidation furnace using a temperature of preferably from about 950 to 1150° C. and more preferably from about 1000 to 1100° C. Liner oxide 32 is formed to a thickness of preferably from about 180 to 620 Å and more preferably from about 200 to 600 Å.

As is shown in FIG. 11, oxidation also occurs at the exposed edge or side wall of patterned undoped poly layer 14'.

The STI trench 28' corner 30 will be rounded by the liner oxidation process combined with a pull back of patterned pad oxide layer 12'/patterned undoped poly layer 14'.

Deposition of STI Fill Layer 34

Figure 12:
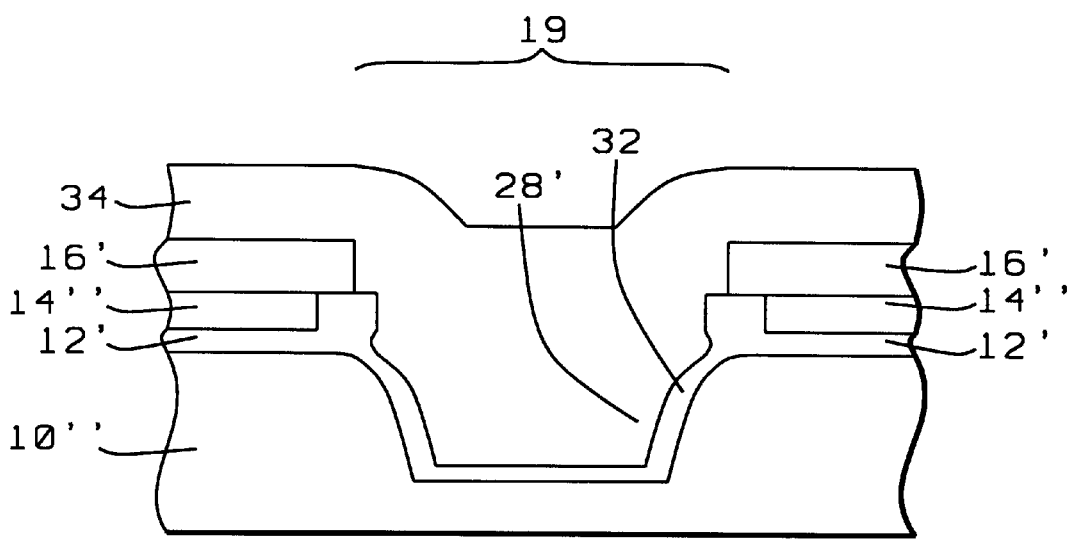

As shown in FIG. 12, an STI fill layer 34 is deposited over liner oxide 32 and patterned SiN layer 16', filling liner oxide 32 lined STI trench 28'. STI fill layer 34 is preferably comprised of high-density plasma silicon oxide.

Planarization of STI Fill Layer 34

Figure 13:
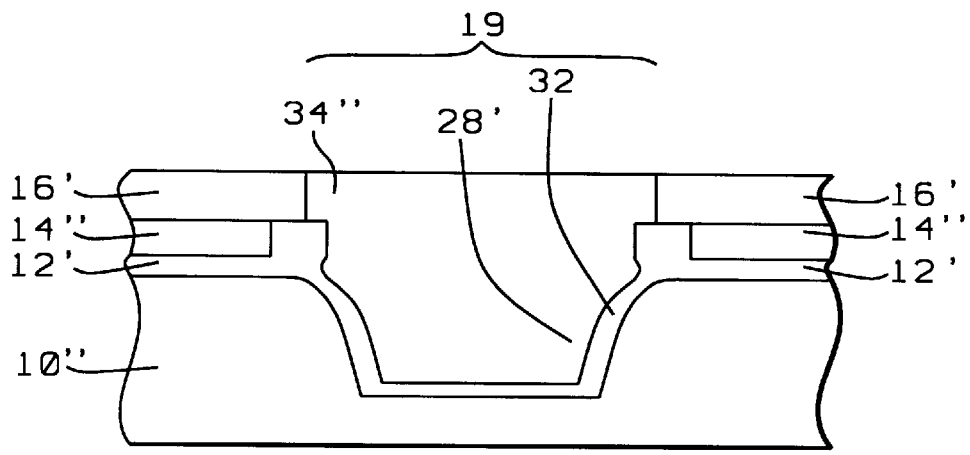

As shown in FIG. 13, STI fill layer 34 is planarized, stopping on the upper surface of patterned SiN layer 16, to form planarized STI fill layer 34'. STI fill layer 34 is preferably planarized by chemical mechanical polishing (CMP) using an oxide slurry.

Removal of Patterned SiN Layer 16 and Patterned Undoped Poly Layer 14"

Figure 14:
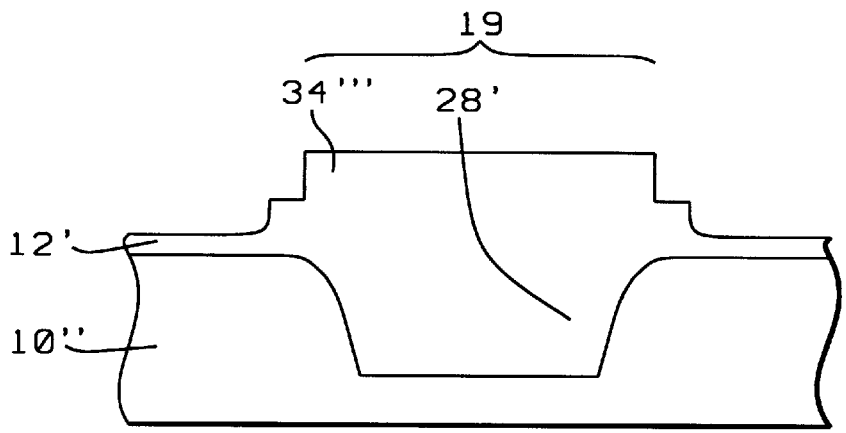

As shown in FIG. 14, patterned SiN layer 16 is removed preferably using a traditional HPO solution, i.e. $H_3PO_4/H_2O_2/H_2O$, and patterned undoped poly layer 14" is then removed preferably using an SC1 solution, i.e. $H_2O/NH_4OH/H_2O_2$, with high poly/oxide selectivity so as not to appreciably remove any of the HDP oxide STI fill layer 34".

As illustrated in FIG. 14, liner oxide 32 and STI fill layer 34" are essentially indistinguishable and are represented as just STI fill layer 34'" unless otherwise specified.

Removal of Patterned Pad Oxide Layer 12' to Form Divot-Free STI Structure 38

Figure 15:
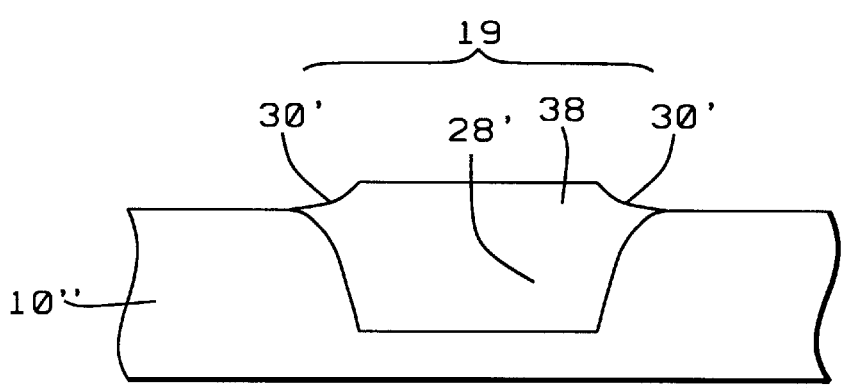

As shown in FIG. 15, patterned pad oxide layer 12' is removed by a process that also removes a portion of the HDP oxide STI fill layer 34'" to form rounded corner 30', divot-free STI structure 38.

Second Embodiment—silicon-rich Oxide Spacers 56 Using Si 10/Pad Oxide 42/SiN 44 Scheme (FIGS. 16 to 30)

Initial Structure

Figure 16:
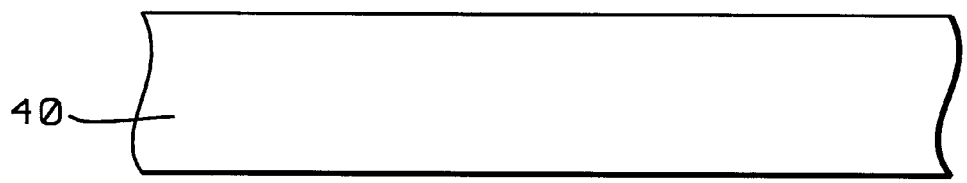
FIGS. 16 to 30 schematically illustrate a second preferred embodiment of the present invention.

As shown in FIG. 16, structure 40 is preferably a silicon substrate and is more preferably a silicon semiconductor substrate.

Growth of Pad Oxide Layer 42

Figure 17:
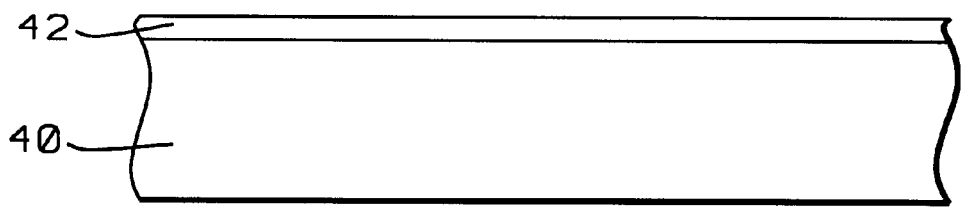

As shown in FIG. 17, pad oxide layer 42 is grown by any common oxidation process over silicon substrate 40 to a thickness of preferably from about 140 to 210 Å and more preferably from about 150 to 200 Å.

Deposition of Nitride Layer 44

Figure 18:
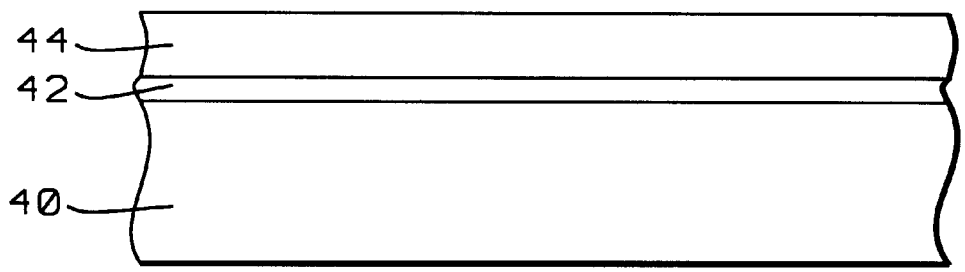

As shown in FIG. 18, a nitride or more preferably a silicon nitride (SiN) layer 44 is deposited over pad oxide layer 42 to a thickness of preferably from about 900 to 2100 Å and more preferably from about 1000 to 2000 Å. Silicon nitride layer 44 is preferably formed using a low pressure chemical vapor deposition (LPCVD) furnace.

Definition of Active Area 49

Figure 19:
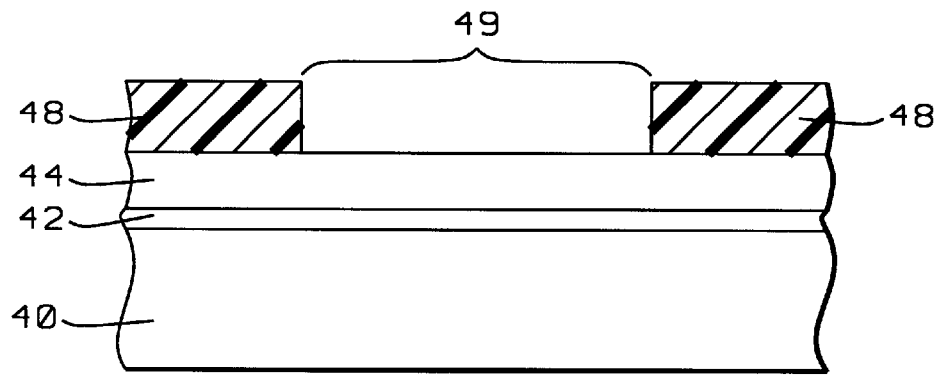

As shown in FIG. 19, a patterned photoresist (PR) layer 48 is formed over the nitride film 44 to define an active area 49.

Etching of Layers 44 and 42

Figure 20:
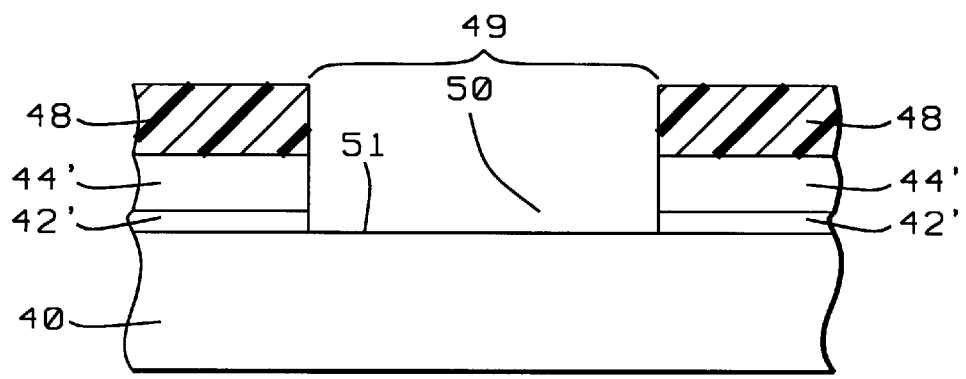

As shown in FIG. 20 and using patterned PR layer 48 as a mask, nitride film 44 and pad oxide layer 42 are etched with a dry etch process to form opening 50 exposing a portion 51 of silicon substrate 40. The dry etch process is conducted at parameters which minimize the loss of silicon from silicon substrate 40 during the dry etch process.

Removal of Patterned PR Layer 48

Figure 21:
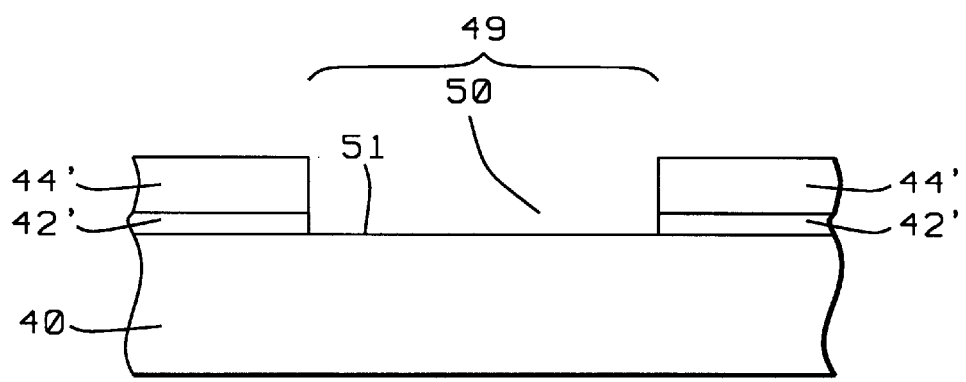
Figure 22:
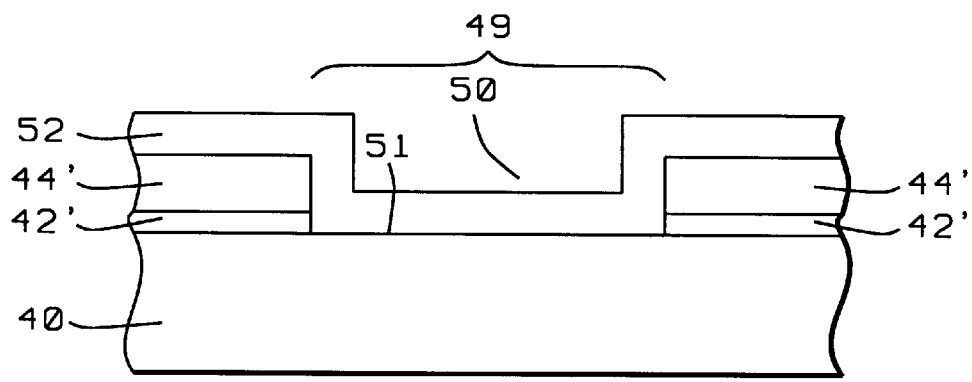

As shown in FIG. 21, the patterned PR layer 48 is removed and the structure is cleaned as necessary.

Deposition of Silicon-Rich Oxide Film 52

Figure 24:
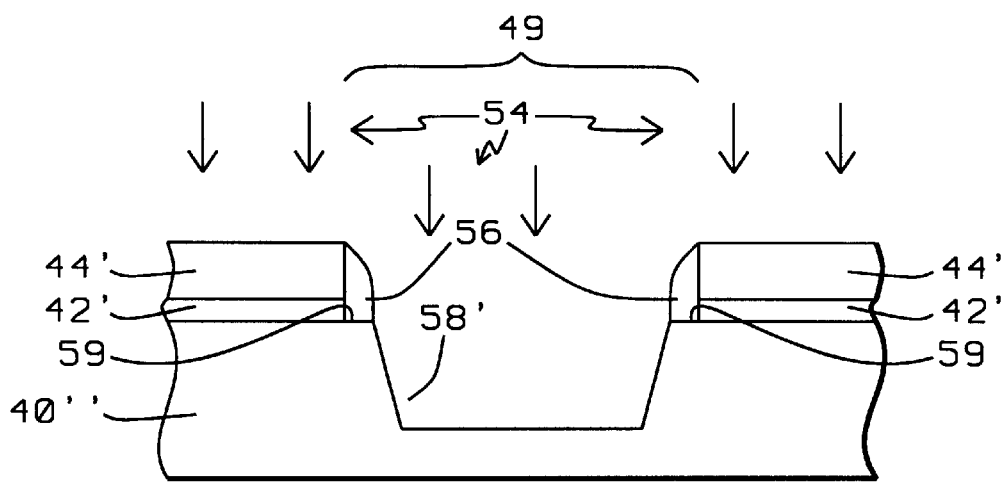

As shown in FIG. 24, a silicon-rich oxide (SRO) film 52 is formed over patterned nitride film 44' and lining opening 50 by using either a plasma enhanced CVD (PECVD) tool. SRO film 52 has a thickness of preferably from about 280 to 520 Å and more preferably from about 300 to 500 Å.

Partial STI Opening 58 Dry Etch 54—Key Step of the Invention

Figure 23:
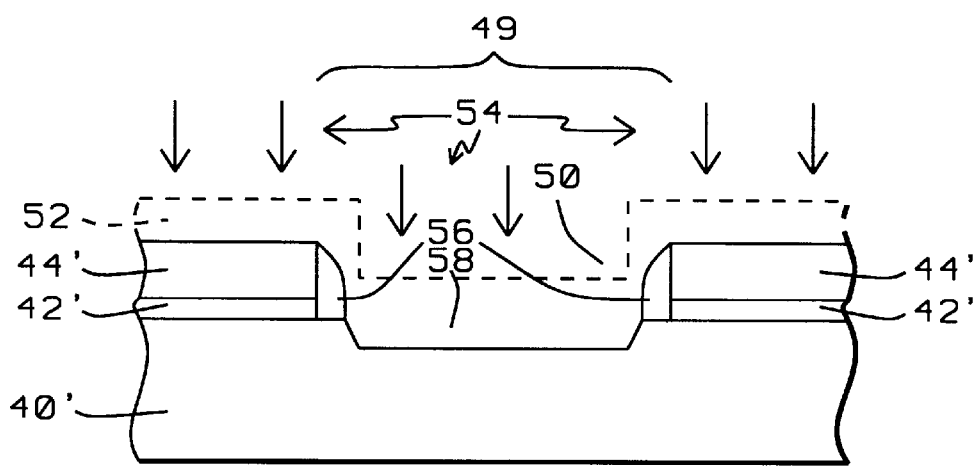

As shown in FIG. 23, an STI dry etch process 54 is initiated using the patterned SiN layer 44' as a hard mask (which has less micro-loading due to low polymer generation) to form partial STI opening 58 within silicon substrate 40.

In a key step of the invention and as is shown in dotted line in FIG. 23, SRO film 52 is etched leaving in-situ poly spacers 56 along the side walls of patterned: SiN layer 44'/pad oxide layer 42' of opening 50. In-situ SRO spacers 56 cover a portion 59 of silicon substrate portion 51 so that partial STI opening 58 has a width less than silicon substrate portion 51. This will, as shown and described below, lead to rounded corners 60' of completed STI structure 68.

Completion of the STI Dry Etch Process 54 to Complete STI Trench 58'

FIG. 24 illustrates the continuation of the STI dry etch 54 and completion of the STI dry etch process 54 to complete formation of STI trench 58'. Since the etch rate of the LPCVD in-situ SRO spacers 56 is lower than the etch rate of the silicon substrate 40, the in-situ SRO spacers 56 remain and results in a pull-back of the patterned: SiN layer 44'/pad oxide layer 42'. This allows for rounded corners 60 to be formed at the upper edges of complete STI trench 58' (see below).

Removal of SRO Spacers 56

Figure 25:
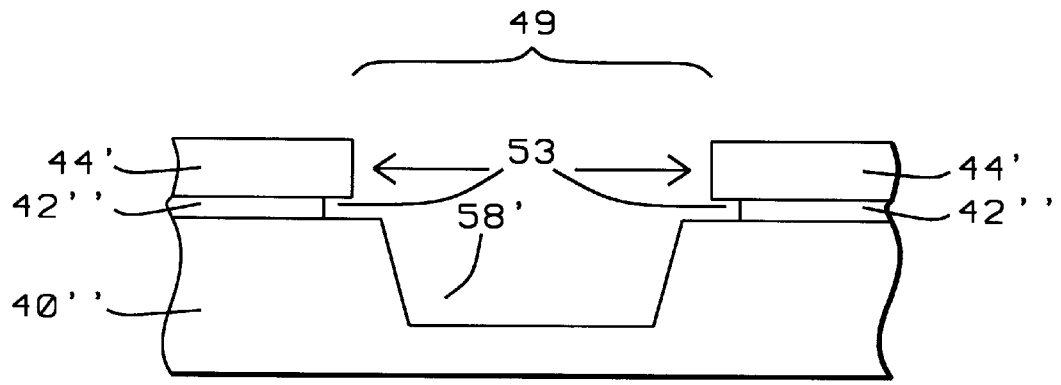

As shown in FIG. 25, the SRO spacers 56 are removed using an HF solution which also further pulls back the patterned pad oxide layer 42' as at 53 to form a further pulled back pad oxide layer 42".

Formation of Liner Oxide 62

Figure 26:
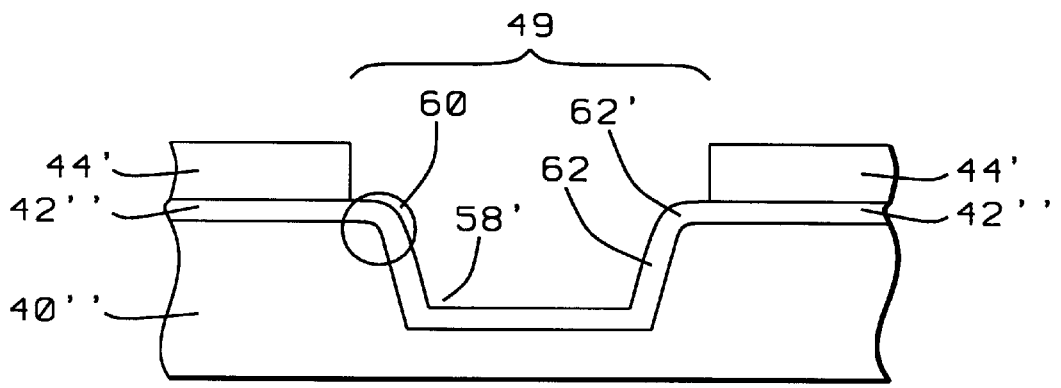

As shown in FIG. 26, liner oxide 62 is formed over the exposed portions of the etched silicon substrate 40" using a high temperature oxidation furnace having a temperature of preferably from about 950 to 1150° C. thru-out and more preferably from about 1000 to 1100° C.

The liner oxide 62 is preferably from about 180 to 620 Å thick and more preferably from about 200 to 600 Å thick. The STI corner (as at 60) will be rounded by the liner oxidation combined with the further pulled back patterned SiN layer 44'/patterned pad oxide layer 42".

As shown in FIG. 26 and thereafter, the liner oxide 62 and the pulled back patterned pad oxide layer 42" become essentially indistinguishable and will be referred to hereafter as just liner oxide 62' unless otherwise specified.

Deposition of STI Fill Layer 64

Figure 27:
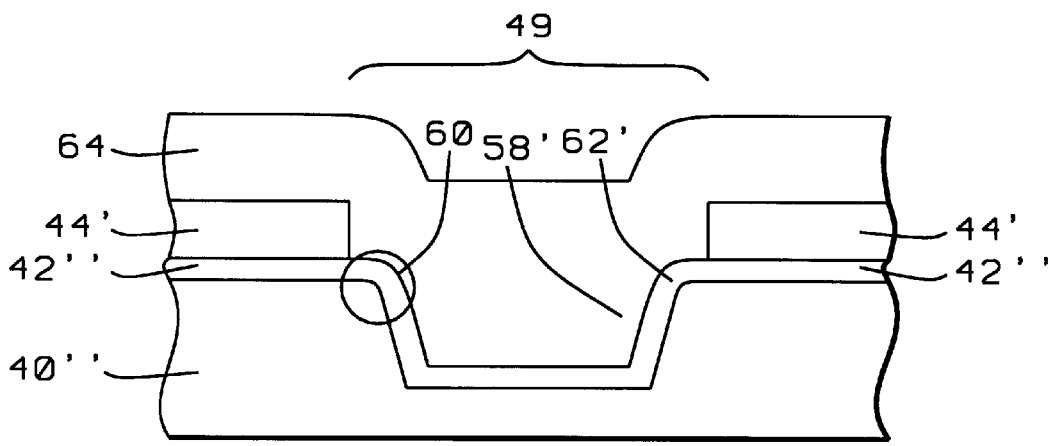

As shown in FIG. 27, an STI fill layer 64 is deposited over liner oxide 62' and patterned SiN layer 44', filling liner oxide 62' lined STI trench 58'. STI fill layer 64 is preferably comprised of high-density plasma (HDP) silicon oxide.

Planarization of STI Fill Layer 64

Figure 28:
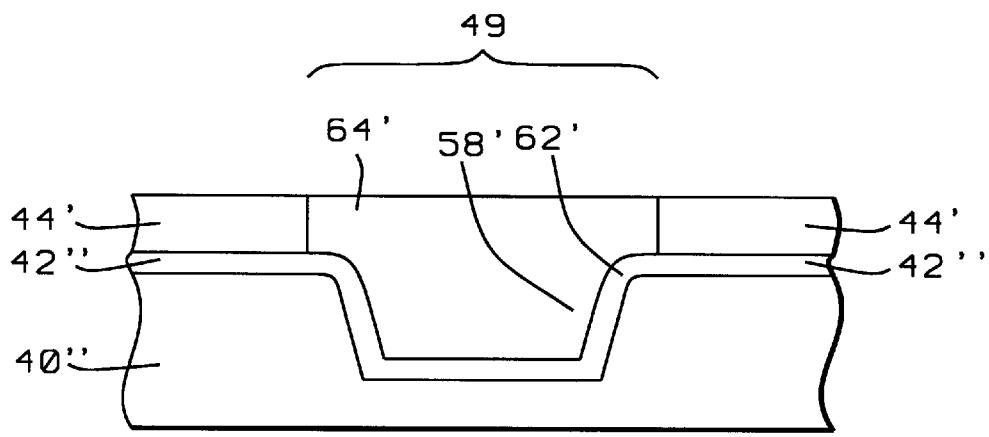

As shown in FIG. 28, STI fill layer 64 is planarized, stopping on the upper surface of patterned SiN layer 44" to form planarized STI fill layer 64'. STI fill layer 64 is preferably planarized by chemical mechanical polishing (CMP) using an oxide slurry.

Removal of Patterned Nitride Film 44"

Figure 29:
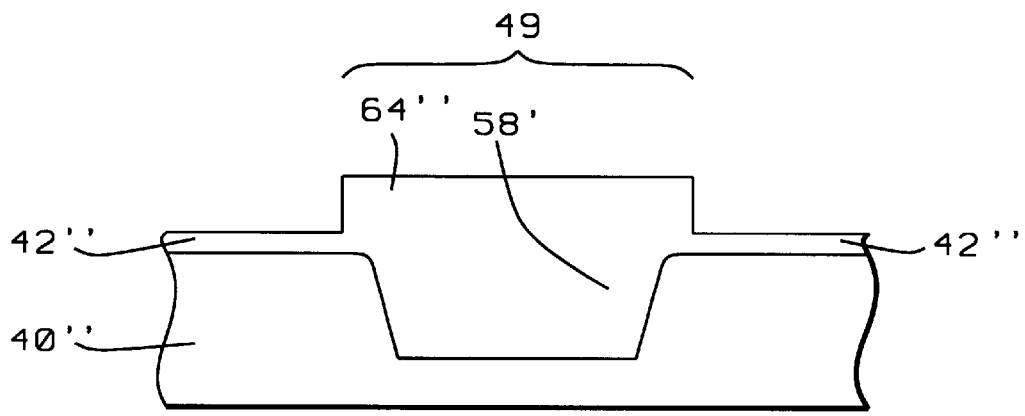

As shown in FIG. 29, the patterned nitride film 44" is removed preferably using $H_3PO_4$ ($H_2O/H_3PO_4/H_2O_2$) without an oxide etch so that none of the HDP oxide STI fill layer 64' is appreciably removed.

As illustrated in FIG. 29, liner oxide 62' and planarized STI fill layer 64' are essentially indistinguishable and are represented as just planarized STI fill layer 64".

Final STI Structure 68

Figure 30:
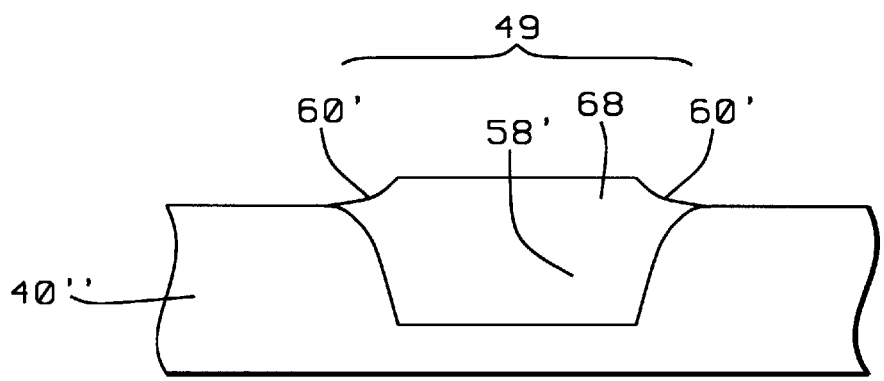

As shown in FIG. 30, the patterned pad oxide layer 42" portion of composite liner oxide 62' is removed to form the final STI structure 68 that has rounded corners 60' and without divots.

Third Embodiment—silicon-rich Oxide Spacers 76 Using Si 70/Pad Oxide 72/Undoped Poly74/SiN 76 Scheme (FIGS. 31 to 46)

Figure 31:
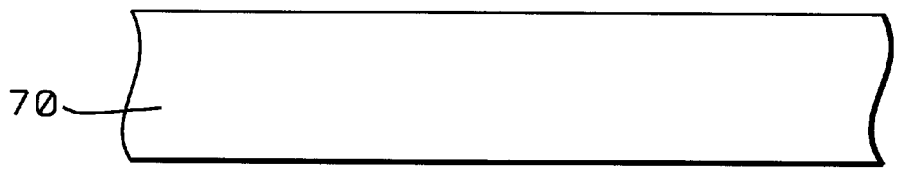
FIGS. 31 to 46 schematically illustrate a third preferred embodiment of the present invention.

Except as noted, the third embodiment of the present invention is essentially equivalent to the second embodiment but with the addition of an undoped polysilicon Initial Structure As shown in FIG. 31, structure 70 is preferably a silicon substrate and is more preferably a silicon semiconductor substrate.

Growth of Pad Oxide Layer 72

Figure 32:
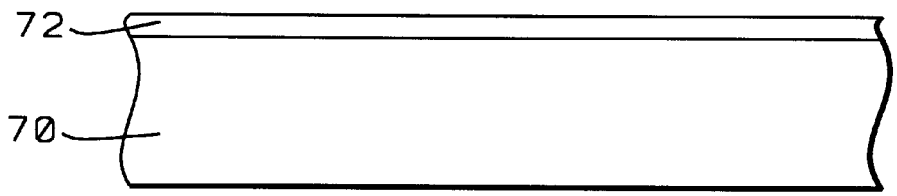

As shown in FIG. 32, pad oxide layer 72 is grown by any common oxidation process over silicon substrate 70 to a thickness of preferably from about 140 to 210 Å and more preferably from about 150 to 200 Å.

Deposition of Poly Layer 74

Figure 33:
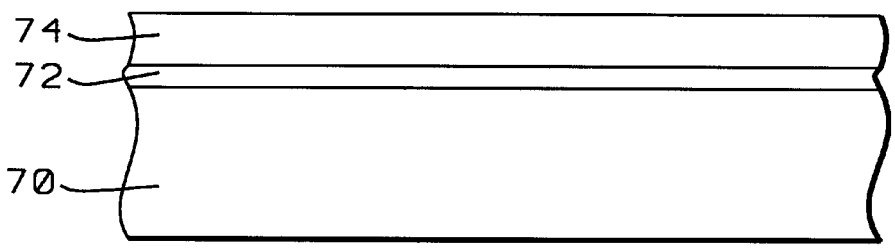

As shown in FIG. 33, undoped polysilicon (poly) layer 74 is formed over pad oxide layer 72 to a thickness of preferably from about 450 to 1150 Å and more preferably from about 500 to 1000 Å preferably using an LPCVD furnace.

Deposition of Nitride Layer 76

Figure 34:
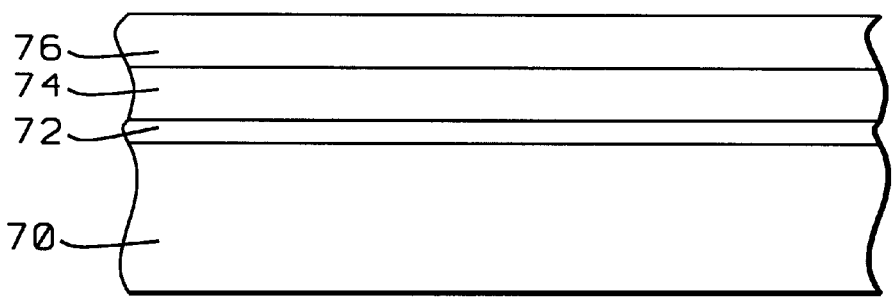

As shown in FIG. 34, a nitride or more preferably a silicon nitride (SiN) layer 76 is deposited over poly layer 74 to a thickness of preferably from about 900 to 2100 Å and more preferably from about 1000 to 2000 Å. Silicon nitride layer 44 is preferably formed using a low pressure chemical vapor deposition (LPCVD) furnace.

Definition of Active Area 79

Figure 35:
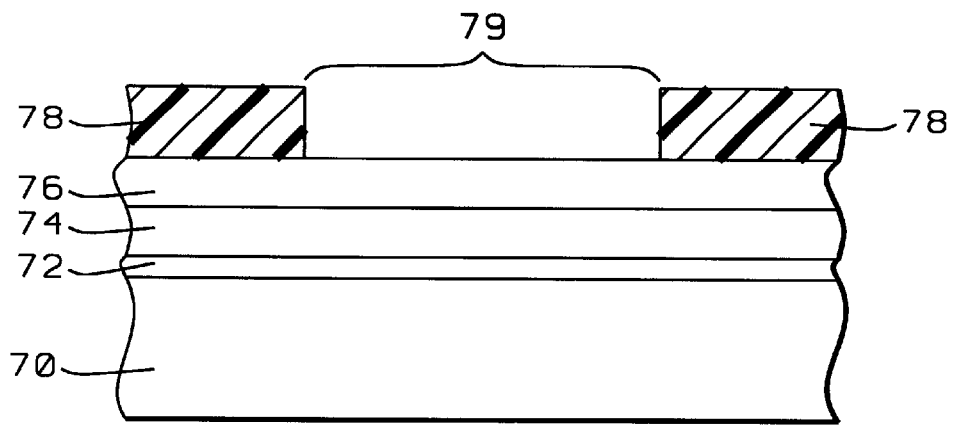

As shown in FIG. 35, a patterned photoresist (PR) layer 78 is formed over the nitride film 76 to define an active area 79.

Etching of Layers 76, 74 and 72

Figure 36:
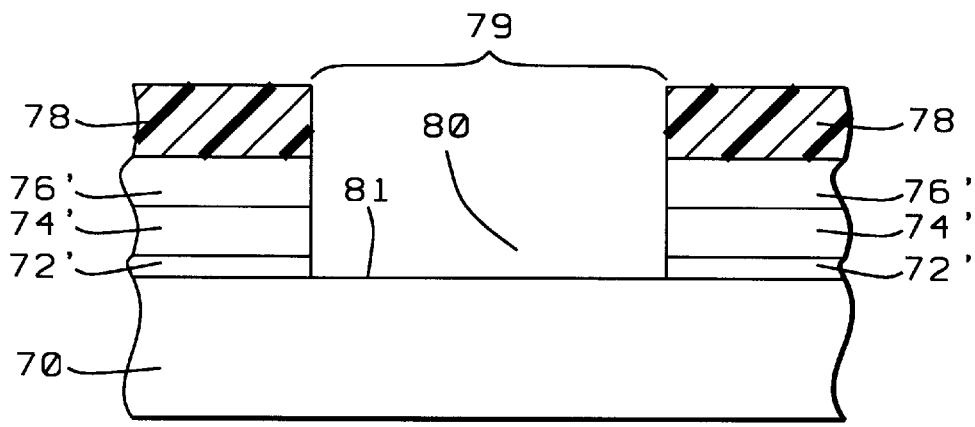

As shown in FIG. 36 and using patterned PR layer 78 as a mask, nitride film 76, poly layer 74 and pad oxide layer 72 are etched with a dry etch process to form opening 80 exposing a portion 81 of silicon substrate 70. The dry etch process is preferably conducted at parameters which minimize the loss of silicon from silicon substrate 40 during the dry etch process.

Removal of Patterned PR Layer 78

Figure 37:
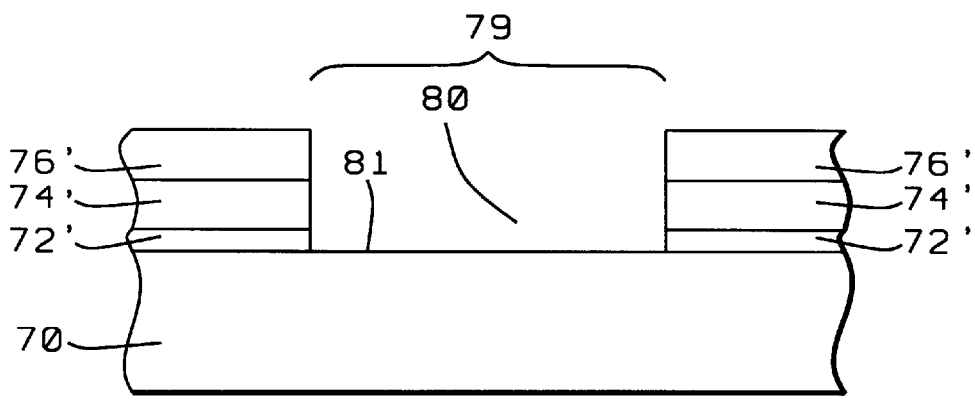

As shown in FIG. 37, the patterned PR layer 78 is removed and the structure is cleaned as necessary.

Deposition of Silicon-Rich Oxide Film 82

Figure 38:
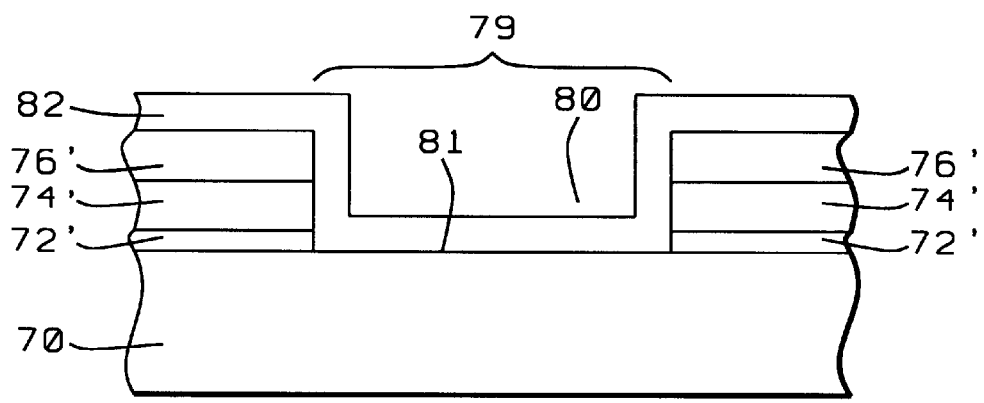

As shown in FIG. 38, a silicon-rich oxide (SRO) film 82 is formed over patterned nitride film 76' and lining opening 80 by using either a plasma enhanced CVD (PECVD) tool. SRO film 82 has a thickness of preferably from about 280 to 520 Å and more preferably from about 300 to 500 Å.

Partial STI Opening 88 Dry Etch 84—Key Step of the Invention

Figure 39:
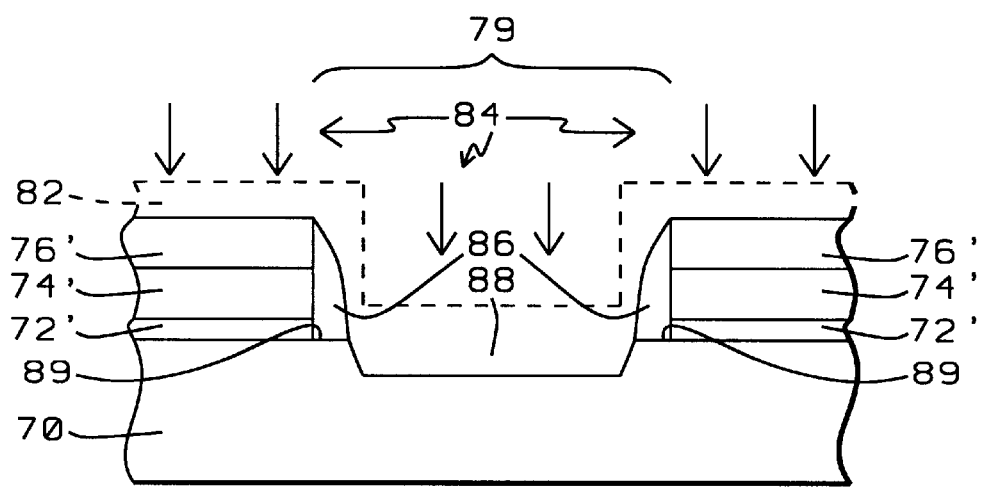

As shown in FIG. 39, an STI dry etch process 84 is initiated using the patterned SiN layer 76' as a hard mask (which has less micro-loading due to low polymer generation) to form partial STI opening 88 within silicon substrate 70.

In a key step of the invention and as is shown in dotted line in FIG. 39, SRO film 82 is etched leaving in-situ poly spacers 86 along the side walls of patterned: SiN layer 76/poly layer 74'/pad oxide layer 72' of opening 80. In-situ SRO spacers 86 cover a portion 89 of silicon substrate portion 81 so that partial STI opening 88 has a width less than silicon substrate portion 71. This will, as shown and described below, lead to rounded corners 90' of completed STI structure 98.

Completion of the STI Dry Etch Process 84 to Complete STI Trench 88'

Figure 40:
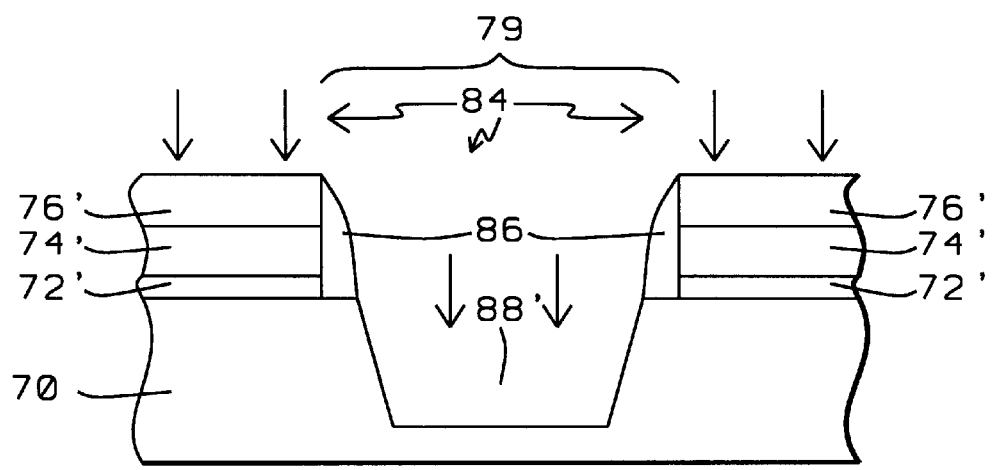

FIG. 40 illustrates the continuation of the STI dry etch 84 and completion of the STI dry etch process 84 to complete formation of STI trench 88'. According to the etch rate of SRO being lower than the Si substrate 70 etch rate, the LPCVD in-situ SRO spacers 86 the in-situ SRO spacers 86 remain and results in a pull-back of the patterned: SiN layer 76'/poly layer 74'/pad oxide layer 72'. This allows for rounded corners 90 to be formed at the upper edges of complete STI trench 88' (see below).

Removal of SRO Spacers 86

Figure 41:
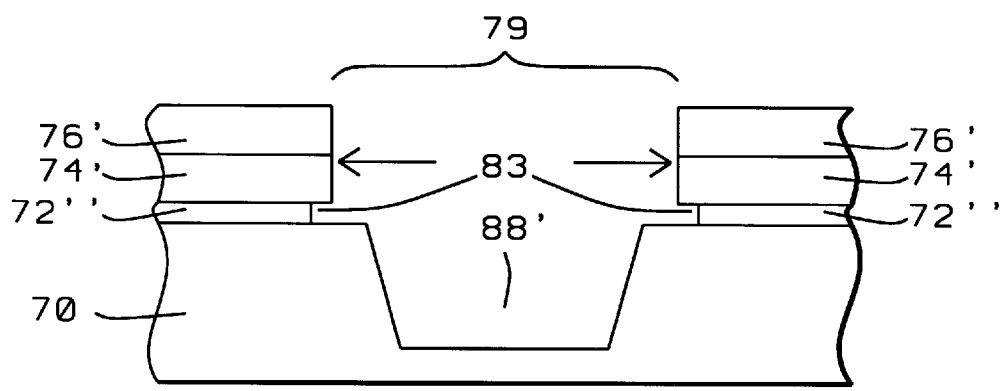

As shown in FIG. 41, the SRO spacers 86 are removed using an HF solution which also further pulls back the patterned pad oxide layer 72' as at 83 to form a further pulled back pad oxide layer 72".

Formation of Liner Oxide 92

Figure 42:
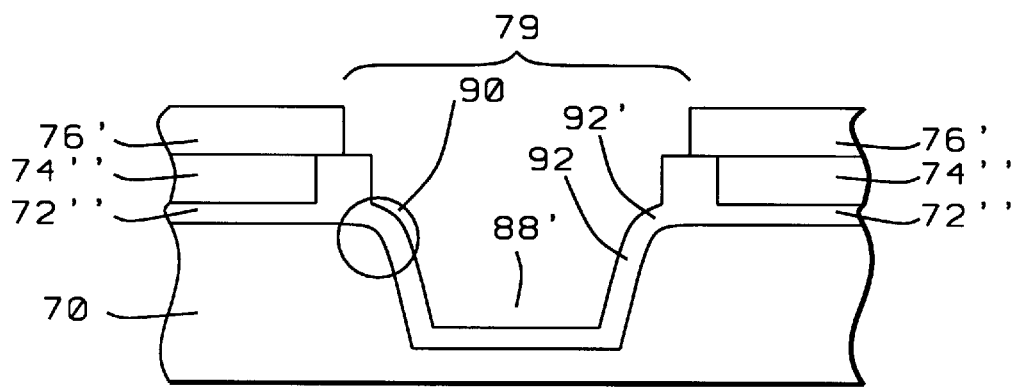

As shown in FIG. 42, liner oxide 92 is formed over the exposed portions of the etched silicon substrate 70" and the patterned poly layer 74' using a high temperature oxidation furnace having a temperature of preferably from about 950 to 1150° C. and more preferably from about 1000 to 1100° C.

The liner oxide 92 is preferably from about 180 to 620 Å thick and more preferably from about 200 to 600 Å thick. The STI corner (as at 90) will be rounded by the liner oxidation combined with the further pulled back patterned SiN layer 74'/patterned poly layer 74'/patterned pad oxide layer 72".

As shown in FIG. 42 and thereafter, the liner oxide 92, the pulled back patterned pad oxide layer 72" and the oxidized portion of patterned poly layer 74" become essentially indistinguishable and will be referred to hereafter as just liner oxide 92' unless otherwise specified.

Deposition of STI Fill Layer 94

Figure 43:
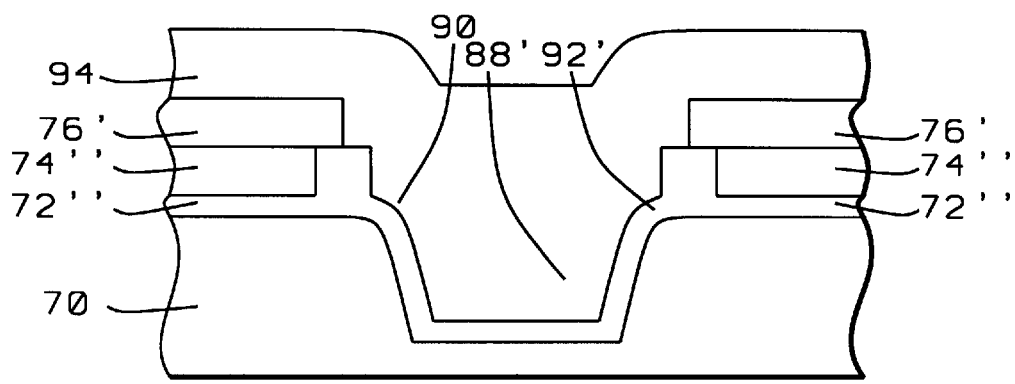

As shown in FIG. 43, an STI fill layer 94 is deposited over liner oxide 92' and patterned SiN layer 76', filling liner oxide 92' lined STI trench 88'. STI fill layer 94 is preferably comprised of high-density plasma (HDP) silicon oxide.

Planarization of STI Fill Layer 64

Figure 44:
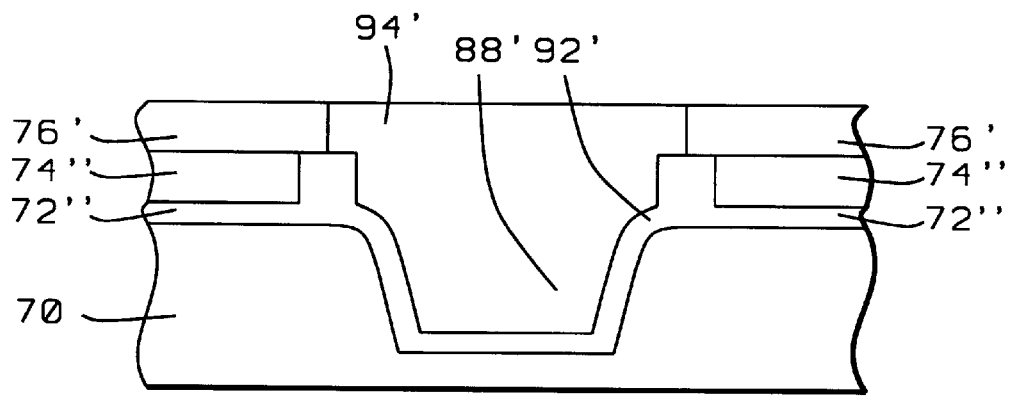

As shown in FIG. 44, STI fill layer 94 is planarized, stopping on the upper surface of patterned SiN layer 76' to form planarized STI fill layer 94'. STI fill layer 94 is preferably planarized by chemical mechanical polishing (CMP) using an oxide slurry.

Removal of Patterned Nitride Film 76' and Patterned Poly Layer 74"

Figure 45:
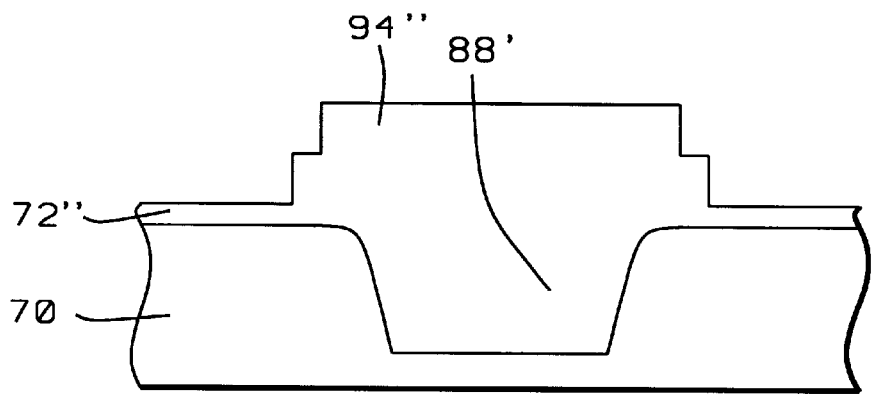

As shown in FIG. 45, the patterned nitride film 44" is removed preferably using HPO ($H_2O/H_3PO_4/H_2O_2$), and patterned poly layer 74" is then removed preferably using an SC1 solution, i.e. $H_2O/NH_4OH/H_2O_2$, with high poly/oxide selectivity so as not to appreciably remove any of the HDP oxide STI fill layer 94".

As illustrated in FIG. 45, liner oxide 92' and planarized STI fill layer 94' are essentially indistinguishable and are represented as just planarized STI fill layer 94" unless otherwise specified.

Final STI Structure 98

Figure 46:
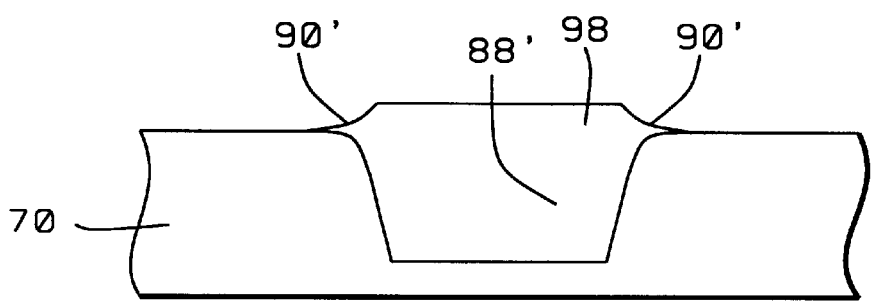

As shown in FIG. 46, the patterned pad oxide layer 72" portion of composite planarized STI fill layer 94" is removed to form the final STI structure 98 that has rounded corners 90' and without divots.

Advantages of the Present Invention

The advantages of one or more embodiments of the present invention include:

1. smooth STI profile for rounded corner; and
2. divot-free STI scheme.

The present invention provides novel STI fabrication methods using different spacers formed during the STI trench etch process. The spacers, polysilicon spacers of the first embodiment or SRO spacers of the second and third embodiment, result in smoother STI side wall or equivalent to the "pull back" for exposing the corner to subsequent liner oxidation. No additional spacer etch step is needed through the use of the polysilicon or SRO films/layers.

In this way, the STI corner is more rounded and the STI is divot-free. The nitride film/layer and spacers serve as hard masks during the silicon substrate STI trench etching with the spacers being completely etched away during the STI etch process. The STI silicon substrate trench using a hard mask provides less micro-loading with low polymer generation.

The STI fabrication methods disclosed herein are compatible with future 0.1 μm CMOS devices.

While particular embodiments of the present invention have been illustrated and described, it is not intended to limit the invention, except as defined by the following claims.

We claim:

1. A method of fabricating an STI structure, comprising the steps of:

providing a silicon structure having a pad oxide layer formed thereover;

forming a hard mask layer over the pad oxide layer;

patterning the hard mask layer and the pad oxide layer to form an opening exposing a portion of the silicon structure; the opening having exposed side walls;

forming a spacer layer over the patterned hard mask layer, the exposed side walls of the opening and lining the opening;

subjecting the structure to an STI trench etching process to:

remove the spacer layer from over the patterned hard mask layer;

form spacers over the side walls; the spacers being formed in-situ from the spacer layer; and etch an STI trench within the silicon structure wherein the spacers serve as masks during at least a portion of time in which the STI trench is formed; the STI trench having corners;

removing any remaining portion of the spacers;

forming a liner oxide at least within the STI trench whereby the liner oxide has rounded corners proximate the STI trench corners;

forming an STI fill layer over the patterned hard mask layer and filling the liner oxide lined STI trench;

planarizing the STI fill layer, stopping on the patterned hard mask layer; and removing the patterned hard mask layer and the patterned pad oxide layer to form a divot-free STI structure having rounded corners.

2. The method of claim 1, wherein: the pad oxide layer is from about 140 to 210 Å thick; the hard mask layer is from about 900 to 2100 Å thick and the liner oxide is from about 180 to 620 Å thick.

3. The method of claim 1, wherein: the pad oxide layer is from about 150 to 200 Å thick; the hard mask layer is from about 1000 to 2000 Å thick and the liner oxide is from about 200 to 600 Å thick.

4. The method of claim 1, wherein the STI fill layer is planarized by chemical mechanical polishing.

5. The method of claim 1, wherein the silicon structure is a silicon substrate.

6. The method of claim 1, wherein the silicon structure is a silicon semiconductor substrate.

7. The method of claim 1, wherein the hard mask layer is comprised of nitride or silicon nitride and the spacer layer is comprised of undoped polysilicon or SRO.

8. The method of claim 1, wherein the hard mask layer is comprised of silicon nitride formed within an LPCVD furnace and the spacer layer is comprised of undoped polysilicon or SRO.

9. The method of claim 1, wherein the hard mask layer and the pad oxide layer are patterned using an overlying patterned photoresist layer.

10. The method of claim 1, wherein the hard mask layer and the pad oxide layer are patterned using an overlying patterned photoresist layer and the patterned photoresist layer is removed after the patterning of the hard mask layer and the pad oxide layer.

11. The method of claim 1, wherein the patterned hard mask layer is removed using an $H_2O/H_3PO_4/H_2O_2$ solution.

12. The method of claim 1, wherein an undoped polysilicon layer is formed between the pad oxide layer and the hard mask layer; the undoped polysilicon layer being patterned with the hard mask layer and the pad oxide layer to form the opening; and the undoped polysilicon layer also being removed to form the divot-free STI structure.

13. The method of claim 1, wherein an undoped polysilicon layer having a thickness of from about 400 to 1100 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

14. The method of claim 1, wherein an undoped polysilicon layer having a thickness of from about 500 to 1000 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

15. The method of claim 1, wherein the spacer layer is comprised of undoped polysilicon.

16. The method of claim 1, wherein the spacer layer is comprised of undoped polysilicon formed using an LPCVD furnace.

17. The method of claim 1, wherein the spacers are completely consumed before completion of the formation of the STI trench.

18. The method of claim 1, wherein the spacer layer is comprised of SRO.

19. The method of claim 1, wherein the spacers remain after completion of the formation of the STI trench.

20. The method of claim 1, wherein the spacers remain after completion of the formation of the STI trench and the removal of any remaining portion of the spacers are effectuated using an HF solution whereby the etched pad oxide layer is partially recessed under the overlying patterned hard mask layer.

21. A method of fabricating an STI structure, comprising the steps of:
providing a silicon structure having a pad oxide layer formed thereover; the pad oxide layer being from about 140 to 210 Å thick;
forming a hard mask layer over the pad oxide layer; the hard mask layer being from about 900 to 2100 Å thick;
patterning the hard mask layer and the pad oxide layer to form an opening exposing a portion of the silicon structure; the opening having exposed side walls;
forming a spacer layer over the patterned hard mask layer, the exposed side walls of the opening and lining the opening;
subjecting the structure to an STI trench etching process to:
remove the spacer layer from over the patterned hard mask layer;
form spacers over the side walls; the spacers being formed in-situ from the spacer layer; and
etch an STI trench within the silicon structure wherein the spacers serve as masks during at least a portion of time in which the STI trench is formed; the STI trench having corners;
removing any remaining portion of the spacers;
forming a liner oxide at least within the STI trench whereby the liner oxide has rounded corners proximate the STI trench corners; the liner oxide being from about 180 to 620 Å thick;
forming an STI fill layer over the patterned hard mask layer and filling the liner oxide lined STI trench;
planarizing the STI fill layer stopping on the patterned hard mask layer; and
removing the patterned hard mask layer and the patterned pad oxide layer to form a divot-free STI structure having rounded corners.

22. The method of claim 21, wherein: the pad oxide layer is from about 150 to 200 Å thick; the hard mask layer is from about 1000 to 2000 Å thick and the liner oxide is from about 200 to 600 Å thick.

23. The method of claim 21, wherein the STI fill layer is planarized by chemical mechanical polishing.

24. The method of claim 21, wherein the silicon structure is a silicon substrate.

25. The method of claim 21, wherein the silicon structure is a silicon semiconductor substrate.

26. The method of claim 21, wherein the hard mask layer is comprised of nitride or silicon nitride and the spacer layer is comprised of undoped polysilicon or SRO.

27. The method of claim 21, wherein the hard mask layer is comprised of silicon nitride formed within an LPCVD furnace and the spacer layer is comprised of undoped polysilicon or SRO.

28. The method of claim 21, wherein the hard mask layer and the pad oxide layer are patterned using an overlying patterned photoresist layer.

29. The method of claim 21, wherein the hard mask layer and the pad oxide layer are patterned using an overlying patterned photoresist layer and the patterned photoresist layer is removed after the patterning of the hard mask layer and the pad oxide layer.

30. The method of claim 21, wherein the patterned hard mask layer is removed using an $H_2O/H_3PO_4/H_2O_2$ solution.

31. The method of claim 21, wherein an undoped polysilicon layer is formed between the pad oxide layer and the hard mask layer; the undoped polysilicon layer being patterned with the hard mask layer and the pad oxide layer to form the opening; and the undoped polysilicon layer also being removed to form the divot-free STI structure.

32. The method of claim 21, wherein an undoped polysilicon layer having a thickness of from about 400 to 1000 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

33. The method of claim 21, wherein an undoped polysilicon layer having a thickness of from about 500 to 1000 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

34. The method of claim 21, wherein the spacer layer is comprised of undoped polysilicon.

35. The method of claim 21, wherein the spacer layer is comprised of undoped polysilicon formed using an LPCVD furnace.

36. The method of claim 21, wherein the spacers are completely consumed before completion of the formation of the STI trench.

37. The method of claim 21, wherein the spacer layer is comprised of SRO.

38. The method of claim 21, wherein the spacers remain after completion of the formation of the STI trench.

39. The method of claim 21, wherein the spacers remain after completion of the formation of the STI trench and the removal of any remaining portion of the spacers are effectuated using an HF solution whereby the etched pad oxide layer is partially recessed under the overlying patterned hard mask layer.

40. A method of fabricating an STI structure, comprising the steps of:
providing a silicon structure having a pad oxide layer formed thereover; the pad oxide layer being from about 140 to 210 Å thick;
forming a hard mask layer over the pad oxide layer; the hard mask layer being from about 900 to 2100 Å thick;
patterning the hard mask layer and the pad oxide layer to form an opening exposing a portion of the silicon structure; the opening having exposed side walls;
forming a spacer layer over the patterned hard mask layer, the exposed side walls of the opening and lining the opening; the spacer layer being comprised of undoped polysilicon or SRO;
subjecting the structure to an STI trench etching process to:
remove the spacer layer from over the patterned hard mask layer;
form spacers over the side walls; the spacers being formed in-situ from the spacer layer; and
etch an STI trench within the silicon structure wherein the spacers serve as masks during at least a portion of time in which the STI trench is formed; the STI trench having corners;
removing any remaining portion of the spacers;
forming a liner oxide at least within the STI trench whereby the liner oxide has rounded corners proximate the STI trench corners; the liner oxide being from about 180 to 620 Å thick;
forming an STI fill layer over the patterned hard mask layer and filling the liner oxide lined STI trench;
planarizing the STI fill layer stopping on the patterned hard mask layer; and
removing the patterned hard mask layer and the patterned pad oxide layer to form a divot-free STI structure having rounded corners.

41. The method of claim 40, wherein: the pad oxide layer is from about 150 to 200 Å thick; the hard mask layer is from about 1000 to 2000 Å thick and the liner oxide is from about 200 to 600 Å thick.

42. The method of claim 40, wherein the STI fill layer is planarized by chemical mechanical polishing.

43. The method of claim 40, wherein the silicon structure is a silicon substrate.

44. The method of claim 40, wherein the silicon structure is a silicon semiconductor substrate.

45. The method of claim 40, wherein the hard mask layer is comprised of nitride or silicon nitride.

46. The method of claim 40, wherein the hard mask layer is comprised of silicon nitride formed within an LPCVD furnace.

47. The method of claim 40, wherein the hard mask layer and the pad oxide layer are patterned using an overlying patterned photoresist layer.

48. The method of claim 40, wherein the hard mask layer and the pad oxide layer are patterned using an overlying patterned photoresist layer and the patterned photoresist layer is removed after the patterning of the hard mask layer and the pad oxide layer.

49. The method of claim 40, wherein the patterned hard mask layer is removed using an $H_2O/H_3PO_4/H_2O_2$ solution.

50. The method of claim 40, wherein an undoped polysilicon layer is formed between the pad oxide layer and the hard mask layer; the undoped polysilicon layer being patterned with the hard mask layer and the pad oxide layer to form the opening; and the undoped polysilicon layer also being removed to form the divot-free STI structure.

51. The method of claim 40, wherein an undoped polysilicon layer having a thickness of from about 400 to 1100 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

52. The method of claim 40, wherein an undoped polysilicon layer having a thickness of from about 500 to 1000 Å is formed between the pad oxide layer and the hard mask layer; the undoped polysilicon layer being patterned with the hard mask layer and the pad oxide layer to form the opening; and the undoped polysilicon layer also being removed to form the divot-free STI structure.

53. The method of claim 40, wherein the spacer layer is comprised of undoped polysilicon.

54. The method of claim 40, wherein the spacer layer is comprised of undoped polysilicon formed using an LPCVD furnace.

55. The method of claim 40, wherein the spacers are completely consumed before completion of the formation of the STI trench.

56. The method of claim 40, wherein the spacer layer is comprised of SRO.

57. The method of claim 40, wherein the spacers remain after completion of the formation of the STI trench.

58. The method of claim 40, wherein the spacers remain after completion of the formation of the STI trench and the removal of any remaining portion of the spacers are effectuated using an HF solution whereby the etched pad oxide layer is partially recessed under the overlying patterned hard mask layer.

* * * * *